United States Patent
Lee et al.

(10) Patent No.: US 7,102,875 B2
(45) Date of Patent: Sep. 5, 2006

(54) CAPACITOR WITH ALUMINUM OXIDE AND LANTHANUM OXIDE CONTAINING DIELECTRIC STRUCTURE AND FABRICATION METHOD THEREOF

(75) Inventors: Kee-Jeung Lee, Ichon-shi (KR); Hong Kwon, Ichon-shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 0 days.

(21) Appl. No.: 10/880,372

(22) Filed: Jun. 30, 2004

(65) Prior Publication Data

US 2005/0141168 A1 Jun. 30, 2005

(30) Foreign Application Priority Data

Dec. 29, 2003 (KR) .................. 10-2003-0098521
Dec. 29, 2003 (KR) .................. 10-2003-0098558

(51) Int. Cl.
*H01G 4/06* (2006.01)

(52) U.S. Cl. .................. 361/312; 257/295; 438/240

(58) Field of Classification Search ......... 361/311–313, 361/306.3, 321.2, 305; 257/295, 344, 303, 257/306, 310; 438/3, 13, 240, 244, 197
See application file for complete search history.

(56) References Cited

U.S. PATENT DOCUMENTS

| | | | |
|---|---|---|---|
| 6,541,280 B1 * | 4/2003 | Kaushik et al. | 438/3 |
| 6,770,923 B1 * | 8/2004 | Nguyen et al. | 257/295 |
| 2002/0115252 A1 * | 8/2002 | Haukka et al. | 438/240 |
| 2003/0017639 A1 * | 1/2003 | Ballantine et al. | 438/48 |
| 2003/0205729 A1 | 11/2003 | Basceri et al. | |
| 2003/0213987 A1 | 11/2003 | Basceri et al. | |
| 2004/0038554 A1 | 2/2004 | Ahn et al. | |
| 2004/0046197 A1 | 3/2004 | Basceri et al. | |

* cited by examiner

*Primary Examiner*—Anthony Dinkins
(74) *Attorney, Agent, or Firm*—Mayer, Brown, Rowe & Maw LLP

(57) ABSTRACT

Disclosed is a capacitor with a dielectric structure having an aluminum oxide layer and a lanthanum oxide layer and a fabrication method thereof. The capacitor includes: a lower electrode; a first dielectric layer with a high energy band gap formed on the lower electrode; a second dielectric layer formed on the first dielectric layer, the second dielectric layer with a high dielectric constant, wherein an energy band gap of the second dielectric layer is lower than the energy band gap of the first dielectric layer; and an upper electrode formed on the second dielectric layer.

21 Claims, 8 Drawing Sheets

CAPACITOR WITH ALUMINUM OXIDE AND LANTHANUM OXIDE CONTAINING DIELECTRIC STRUCTURE AND FABRICATION METHOD THEREOF

FIELD OF THE INVENTION

The present invention relates to a method for fabricating a semiconductor device; and, more particularly, to a capacitor with aluminum oxide and lanthanum oxide containing dielectric structure and a fabrication method thereof.

DESCRIPTION OF RELATED ARTS

A recent progression in micronization in semiconductor technology has led to acceleration in achieving a large-scale integration of a memory device. As a result, a unit cell area is decreased and a required operation voltage becomes low. Although the unit cell area is decreased, it is required to have a capacitance greater than 25 fF per cell in order to prevent incidences of soft error and shortened refresh time. Therefore, there have been diverse approaches to secure a required capacitance.

Generally, in a dynamic random access memory (DRAM) device, a dielectric layer of a capacitor is typically formed in a structure of nitride and oxide (NO) with use of silicon nitride ($Si_3N_4$). However, in this case, even though a storage node with a hemispherical electrode is formed in three dimensions, an increase in a height of the storage node is continuously required to secure a sufficient capacitance.

Also, the dielectric layer with the NO structure has a limitation in meeting a required capacitance for a next generation DRAM device with over 256 megabytes. Thus, it has been currently focused on development of a capacitor with a dielectric layer by using materials having a higher dielectric constant than that of $Si_3N_4$. Examples of such high dielectric materials are tantalum oxide ($Ta_2O_5$), aluminum oxide ($Al_2O_3$) and hafnium oxide ($HfO_2$). At this time, $Al_2O_3$ and $HfO_2$ have dielectric constants of 9 and 20, respectively.

However, $Ta_2O_5$ has a high level of leakage currents because of $Ta_2O_5$ has a smaller band gap compared with silicon oxide ($SiO_2$) and $Si_3N_4$. Hence, it is first required to solve the problem of leakage current in order to use $Ta_2O_5$ as the dielectric material. Also, although $Al_2O_3$ is advantageous in the leakage current compared with $Ta_2O_5$, a dielectric constant of $Al_2O_3$ is not high, resulting in a difficulty in meeting a required capacitor capacitance. Compared with the dielectric material of $Al_2O_3$, $HfO_2$ is advantageous in obtaining a large-scale capacitance for highly integrated memory devices applied with a sub 100 nm metal wire process, e.g., DRAM devices with over 256 megabytes, since $HfO_2$ has a high dielectric constant value than $Al_2O_3$.

FIG. 1 is a diagram showing a conventional capacitor structure having a single dielectric layer.

As shown, a capacitor includes a lower electrode 11, a dielectric layer 12 formed on the lower electrode 11 and an upper electrode 13 formed on the dielectric layer. At this time, the dielectric layer 12 is made of $HfO_2$. However, since $HfO_2$ has a lower intensity of a break down electric field, $HfO_2$ is very weak to repeated shocks, thereby degrading durability of a capacitor.

Also, the above described dielectric materials of $Ta_2O_5$, $Al_2O_3$ and $HfO_2$ cannot have a critical tolerance thickness to oxidization when a high thermal process is performed in an atmosphere of oxygen, and a silicon oxide layer is grown abruptly between the lower electrode and the dielectric layer. In this case, the dielectric layer of the capacitor has an abruptly increased equivalent oxide thickness ($T_{ox}$), and thus, it is necessary to maintain the dielectric layer with a thickness greater than a predetermined thickness. As a result, it is difficult to form the dielectric layer with a thin thickness.

Generally, the equivalent oxide thickness ($T_{ox}$) is a value converting a thickness of a dielectric layer made of a material except for silicon oxide into that of a dielectric layer made of silicon oxide. As the equivalent oxide thickness ($T_{ox}$) value is smaller, a capacitance value increases conversely.

In case of using the above mentioned dielectric materials of $Ta_2O_5$, $Al_2O_3$ and $HfO_2$ for forming a single dielectric layer, these dielectric materials may be susceptible to a thermal process, thereby degrading an electric characteristic of a capacitor.

SUMMARY OF THE INVENTION

It is, therefore, an object of the present invention to provide a capacitor with an aluminum oxide and lanthanum oxide containing dual dielectric structure capable of obtaining a large-scale capacitance over approximately 30 fF per cell and a decreased equivalent oxide thickness and a method for fabricating the same.

It is another object of the present invention to provide a method for fabricating a capacitor with an aluminum oxide and lanthanum oxide containing dielectric structure capable of simultaneously improving a leakage current characteristic and a dielectric characteristic.

In accordance with an aspect of the present invention, there is provided a capacitor, including: a lower electrode; a first dielectric layer with a high energy band gap formed on the lower electrode; a second dielectric layer formed on the first dielectric layer, the second dielectric layer with a high dielectric constant, wherein an energy band gap of the second dielectric layer is lower than the energy band gap of the first dielectric layer; and an upper electrode formed on the second dielectric layer.

In accordance with another aspect of the present invention, there is provided a method for fabricating a capacitor, including the steps of: (a) forming a lower electrode; (b) forming a first dielectric layer having a high energy band gap on the lower electrode; (c) forming a second dielectric layer on the first dielectric layer, the second dielectric layer having a high dielectric constant, wherein an energy band gap lower of the second dielectric layer is lower than the energy band gap of the first dielectric layer; and (d) forming an upper electrode on the second dielectric layer.

In accordance with still another aspect of the present invention, there is provided a method for fabricating a capacitor, including the steps of: (a) forming a lower electrode by using impurity doped polysilicon; (b) nitriding the lower electrode; (c) forming a dual dielectric structure by sequentially stacking an aluminum oxide layer and a lanthanum oxide layer on the nitrided lower electrode; (d) performing a thermal process for crystallizing the dual dielectric structure and removing impurities; (e) nitriding the crystallized dual dielectric structure; and (f) forming an upper electrode on the nitrided dual dielectric structure, the upper electrode made of impurity doped polysilicon.

In accordance with further aspect of the present invention, there is provided a method for fabricating a capacitor, including the steps of: (a) forming a lower electrode; (b) alternately stacking a laminated aluminum oxide layer and a laminated lanthanum oxide layer each having a predetermined thickness on the lower electrode by employing an atomic layer deposition method to thereby obtain an alternately stacked dielectric layer; (c) performing a thermal process to the alternately stacked dielectric layer; and (d) forming an upper electrode on the alternately stacked dielectric layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A capacitor with an aluminum oxide and lanthanum oxide containing dielectric structure and a fabrication method thereof in accordance with preferred embodiments of the present invention will be described in detail with reference to the accompanying drawings.

Figure 1:
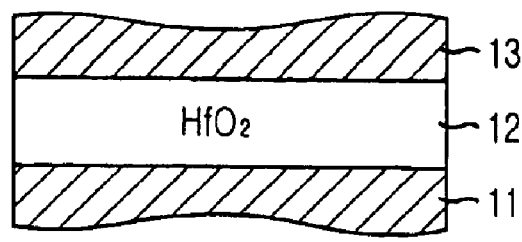
FIG. 1 is a diagram showing a conventional capacitor structure having a single dielectric layer.
Figure 2:
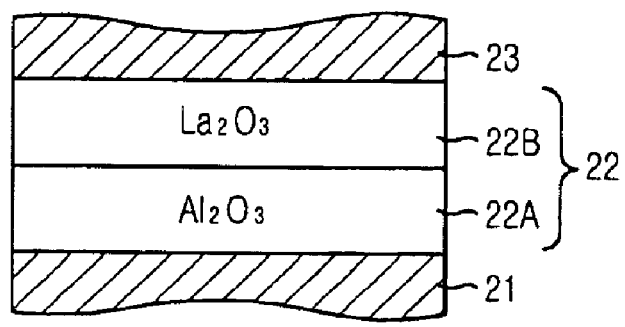
FIG. 2 is a diagram showing a capacitor structure having a dual dielectric layer in accordance with a first preferred embodiment of the present invention.

FIG. 2 is a diagram showing a capacitor with an aluminum oxide ($Al_2O_3$) and lanthanum oxide ($La_2O_3$) dielectric structure in accordance with a first preferred embodiment of the present invention.

As shown, the capacitor includes a lower electrode 21, a dual dielectric structure 22 having a first dielectric layer 22A formed on the lower electrode 21 and a second dielectric layer 22B formed on the first dielectric layer 22A and an upper electrode 23. Herein, the first dielectric layer 22A is made of a dielectric material having a high energy band gap ($E_g$) for the purpose of preventing generation of leakage currents. On the other hand, a second dielectric layer 22B has an energy band gap lower than the first dielectric layer 22A but has a high dielectric constant. The reason for using a high-k dielectric material as the second dielectric layer 22B is to secure a sufficient capacitance. At this time, the energy band gap ($E_g$) of the first dielectric layer 22A has a value greater than approximately 8.0 eV.

Herein, the first dielectric layer 22A and the second dielectric layer 22B are made of aluminum oxide ($Al_2O_3$) and lanthanum oxide ($La_2O_3$), respectively. The aluminum oxide ($Al_2O_3$) layer, i.e., the first dielectric layer 22A, has a dielectric constant of approximately 7 and an energy band gap value of approximately 8.7 eV. The lanthanum oxide ($La_2O_3$) layer, i.e., the second dielectric layer 22B, has a dielectric constant of approximately 30, but has a lower energy band gap value of approximately 4.3 eV. The $Al_2O_3$ layer is formed as the first dielectric layer 22A on the lower electrode 21 in order to control a leakage current value less than approximately 0.5 fF per cell while maintaining a break down voltage value of approximately 2.0 V at approximately 1 pA per cell. Then, the $La_2O_3$ layer 22B having a high dielectric constant of approximately 30 as simultaneously as having a higher conduction band offset (CBO) value of approximately 2.3 eV compared with that of silicon is formed as the second dielectric layer 22B on the $Al_2O_3$ layer, i.e., the first dielectric layer 22A.

The lower electrode 21 and the upper electrode 23 are made of metal-based conductive materials selected from a group consisting of phosphorus (P) or Arsenic (As) doped polysilicon, titanium nitride (TiN), tantalum nitride (TaN), tungsten (W), tungsten nitride (WN), tungsten silicide (WSi), ruthenium (Ru), ruthenium oxide ($RuO_2$), iridium (Ir), iridium oxide ($IrO_2$) and platinum (Pt). Also, each of the lower electrode and the upper electrode has a thickness ranging from approximately 200 Å to approximately 500 Å.

For example, if the lower electrode 21 and the upper electrode 23 are made of polysilicon, a capacitor with a structure of silicon insulator silicon (SIS) is obtained. It is also possible to form a capacitor having a metal insulator metal (MIM) structure by using polysilicon and a metal as the lower electrode and the upper electrode, respectively, or to form a capacitor having a metal insulator metal (MIM) structure by using a metal as the lower electrode and the upper electrode. In addition, the lower electrode 21 can be formed in one of a stack structure, a concave structure and a cylinder structure.

Hereinafter, the first dielectric layer 22A and the second dielectric layer 22B are referred to as the aluminum oxide layer ($Al_2O_3$) and the lanthanum oxide ($La_2O_3$) layer, respectively.

Figure 3:
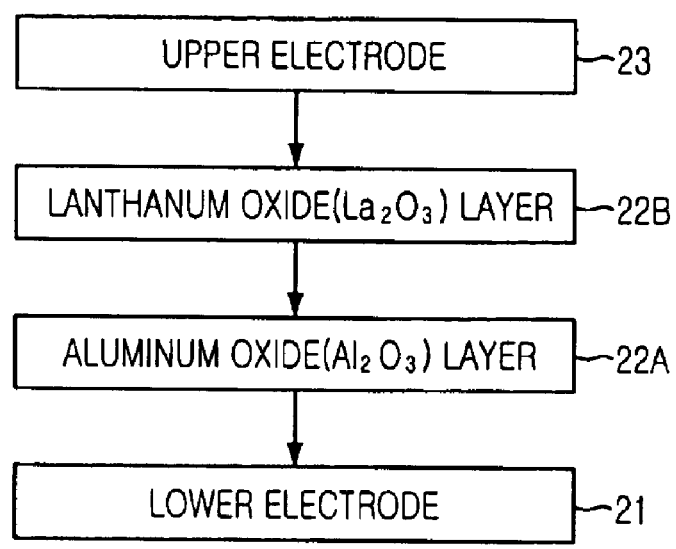
FIG. 3 is a conceptual diagram showing a method for fabricating the capacitor shown in FIG. 2.

FIG. 3 is a conceptual diagram showing a method for forming the capacitor shown in FIG. 2 in accordance with the first preferred embodiment of the present invention.

As shown, the capacitor is formed by including the steps of forming the lower electrode 21, forming the aluminum oxide ($Al_2O_3$) layer 22A on the lower electrode 21, forming the lanthanum oxide ($La_2O_3$) layer 22B on the aluminum oxide layer 22A and forming the upper electrode 23 on the lanthanum oxide layer 22B.

The $Al_2O_3$ layer 22A and the $La_2O_3$ layer 22B are formed by employing one of an atomic layer deposition (ALD) method, a pulsed chemical vapor deposition method and a low pressure chemical vapor deposition (LP-CVD) method.

Figure 4A:
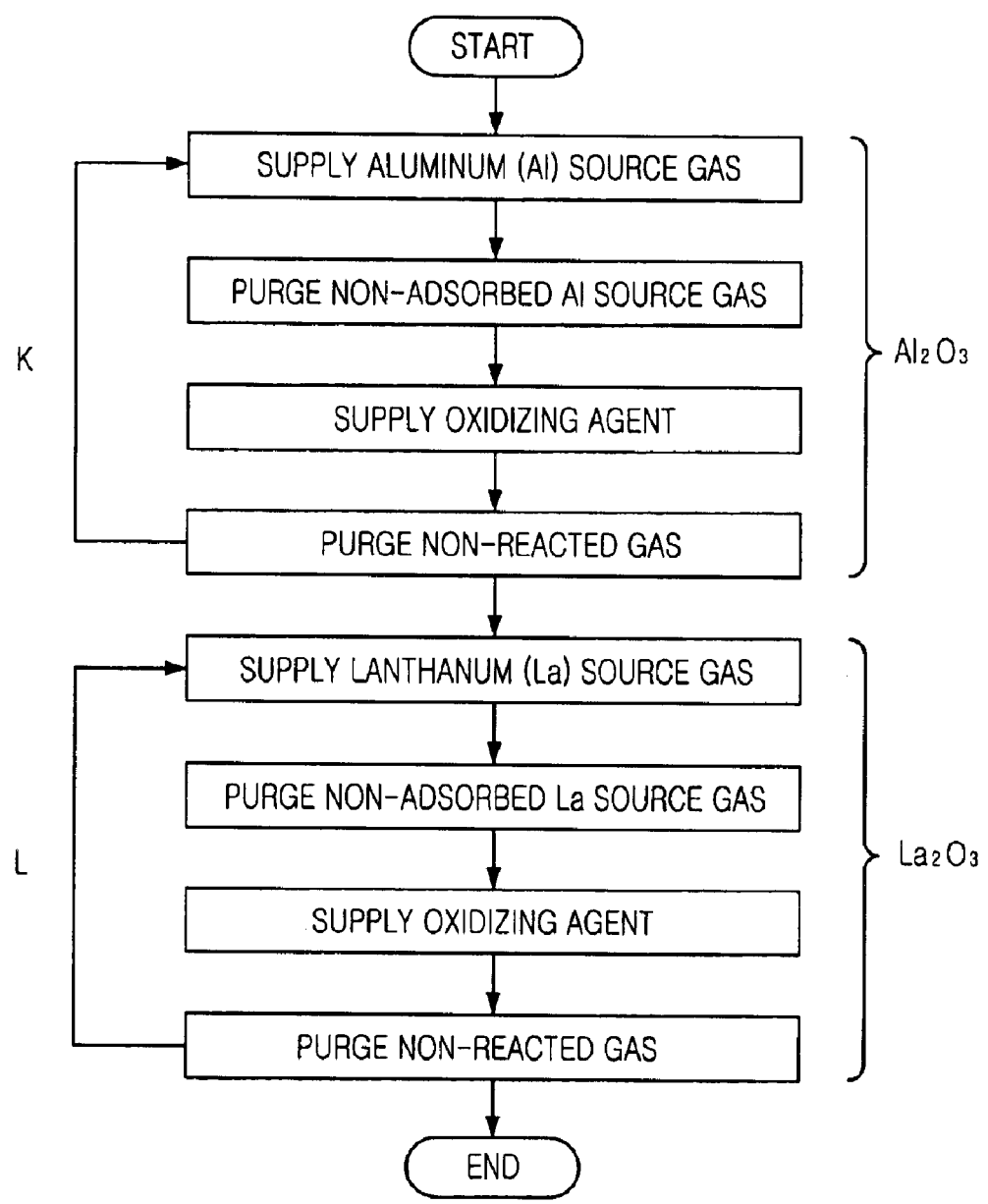
FIG. 4A is a flowchart showing sequential steps of an atomic layer deposition (ALD) method employed for forming a dual dielectric structure having an aluminum oxide layer and a lanthanum oxide layer in accordance with the first preferred embodiment of the present invention.

FIG. 4A is a flowchart showing sequential steps of an ALD method employed for forming the dual dielectric structure of the $Al_2O_3$ layer 22A and the $La_2O_3$ layer 22B shown in FIG. 3 in accordance with the first preferred embodiment of the present invention.

As shown, a cycle of depositing the $Al_2O_3$ layer 22A includes the steps of supplying an aluminum source gas, purging out the non-adsorbed aluminum source gas molecules, supplying an oxidizing agent, and purging out non-reacted gas molecules. This cycle is repeated in K times, where K is a positive integer, thereby obtaining the $Al_2O_3$ layer 22A having a thickness ranging from approximately 5 Å to approximately 30 Å.

Next, a cycle of depositing the $La_2O_3$ layer 22B includes the steps of supplying a lanthanum source gas, purging out the non-adsorbed lanthanum gas molecules, supplying an oxidizing agent, and purging out non-reacted gas molecules. This cycle is repeated in L times, where L is a positive integer, thereby obtaining the $La_2O_3$ layer 22B having a thickness ranging from approximately 10 Å to approximately 50 Å. Through these individually performed deposition cycles, the $Al_2O_3$ layer 22A and the $La_2O_3$ layer 22B are stacked to form the dual dielectric structure having a thickness ranging from approximately 15 Å to approximately 80 Å.

Figure 4B:
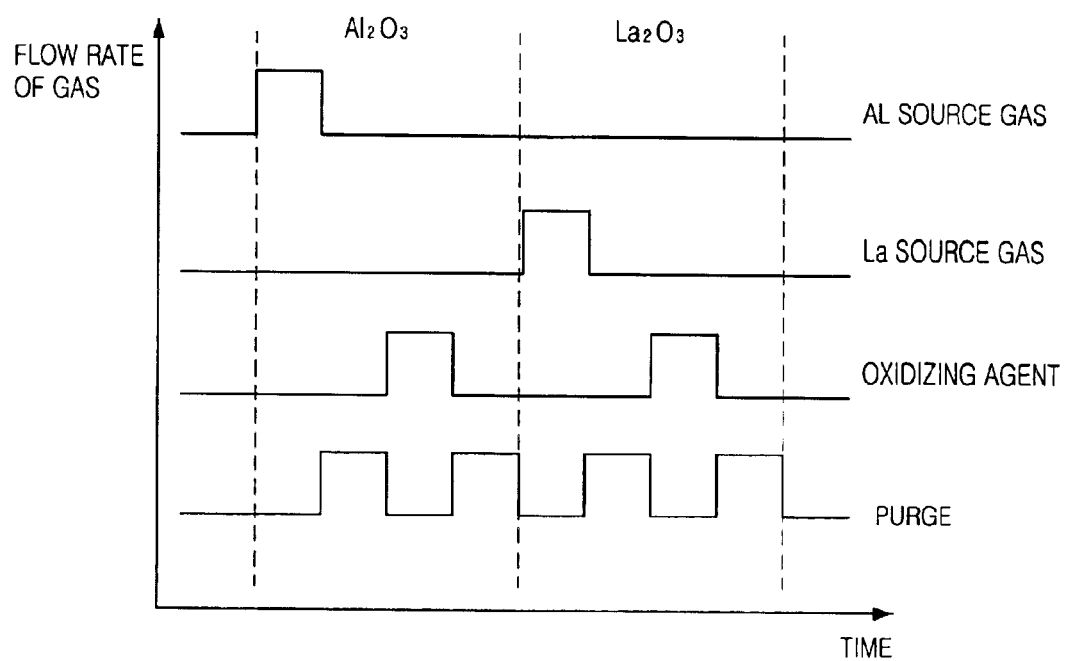
FIG. 4B is a timing diagram showing cycles of the ALD method shown in FIG. 4A.

FIG. 4B is a timing diagram showing the ALD deposition cycles for forming the stack type dual dielectric structure described in FIG. 4A.

As shown, a metal organic compound such as $Al(CH_3)_3$ or $Al(C_2H_5)_3$ is used as a precursor of the aluminum source gas for depositing the $Al_2O_3$ layer 22A. The oxidizing agent is selected from a group consisting of ozone ($O_3$), oxygen ($O_2$) and water ($H_2O$) vapor. Particularly, $O_3$ having a concentration of approximately 200±20 $g/m^3$ is used. Also, such a gas as nitrogen ($N_2$) or argon (Ar) is used as the purge gas.

Also, lanthanum containing metal organic compounds such as $La(CH_3)_3$, $La(C_2H_5)_3$ are used as a precursor of the lanthanum source gas for forming the $La_2O_3$ layer 22B. The oxidizing agent is selected from a group consisting of $O_3$, $O_2$ and $H_2O$ vapor. Particularly, $O_3$ gas having a concentration of approximately 200±20 $g/m^3$ is used. Examples of the purge gas are $N_2$ and Ar.

In addition to the use of ALD method, the above $La_2O_3$ and $Al_2O_3$ stacked dual dielectric structure can be formed by employing a pulsed chemical vapor deposition (CVD) method having cycles of supplying all related gases alternately in a pulsed manner. That is, a source gas and an oxidizing agent are supplied in a pulsed manner to induce a reaction between the source gas and the oxidizing agent. From this reaction, the $Al_2O_3$ and $La_2O_3$ stacked dual dielectric structure is formed. For the pulsed CVD method, such an aluminum containing metal organic compound as $Al(C_2H_5)_3$ is used as a precursor of an aluminum source for depositing the $Al_2O_3$ layer, and such a lanthanum containing organic compound as $La(C_2H_5)_3$ is used as a precursor of a lanthanum source gas for depositing the $La_2O_3$ layer. An oxidizing agent, which is a reaction gas, is selected from a group consisting of $O_3$, $O_2$ and $H_2O$ vapor. At this time, the $O_3$ gas has a concentration of approximately 200±20 $g/m^3$. These source gases and the reaction gas can be used identically in the low process chemical vapor deposition (LP-CVD) method.

Meanwhile, after the formation of the $Al_2O_3$ and $La_2O_3$ stacked dual dielectric structure, a thermal process is employed for the purpose of crystallization and removal of carbon impurities. The thermal process proceeds at a temperature ranging from approximately 500° C. to approximately 900° C. in an atmosphere of $N_2$ at one of an electric furnace and an apparatus for a rapid thermal process (RTP) in an increasing or decreasing pressure.

In case of forming the dual dielectric structure obtained by sequentially stacking the $Al_2O_3$ layer and the $La_2O_3$ layer, even if an equivalent oxide thickness is decreased to approximately 15 Å, it is still possible to have an intended leakage current characteristic and a break down voltage characteristic which do not affect reliability of devices when applied in mass production. Especially, compared with the capacitor having a single dielectric layer of hafnium oxide ($HfO_2$) or aluminum oxide ($Al_2O_3$), the $Al_2O_3$ and $La_2O_3$ stacked dual gate dielectric structure improves heat-resistance, thereby preventing generation of defects in devices caused by deterioration of an electric property during a high thermal process proceeding after the capacitor formation.

FIGS. 5A to 5D are cross-sectional views illustrating a method for fabricating a concave type capacitor having an $Al_2O_3$ and $La_2O_3$ stacked dual dielectric structure in accordance with the first preferred embodiment of the present invention.

Figure 5A:
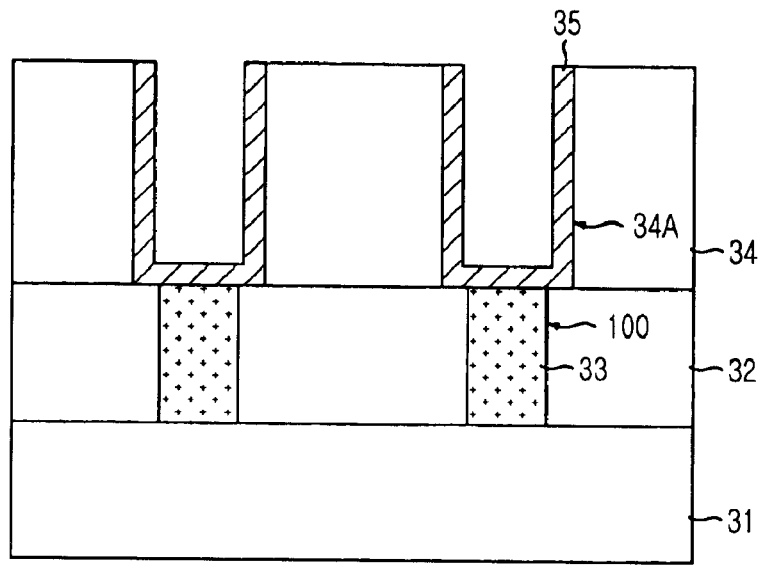
FIGS. 5A to 5D are cross-sectional views illustrating a method for fabricating a concave type capacitor with a dual dielectric structure formed by sequentially stacking an aluminum oxide layer and a lanthanum oxide layer in accordance with the first preferred embodiment of the present invention.

Referring to FIG. 5A, an inter-layer insulation layer 32 is formed on a substrate 31 and is etched to have contact holes 100. A plug material is filled into the contact holes 100, thereby obtaining a plurality of storage node contact plugs 33. Then, a capacitor oxide layer 34 which determines a height of a capacitor is formed on the inter-layer insulation layer 32. The capacitor oxide layer 34 is etched to thereby form a plurality of storage node holes 34A defining a region in which lower electrodes will be formed.

Afterwards, a lower electrode isolation process is carried out to form lower electrodes 35 inside the storage node holes 34A. At this time, the lower electrodes 35 are connected with the storage node contact plugs 33. In more detail of the lower electrode isolation process, a conductive layer for forming a lower electrode is formed on the capacitor oxide layer 34 and on the storage node holes 34A. Then, a chemical mechanical polishing (CMP) process or an etch-back process is employed to remove a portion of the conductive layer disposed on the capacitor oxide layer 34, so that cylinder type lower electrodes 35 are formed inside the storage node holes 34A. Herein, since it is probable that impurities like a polishing agent or etch remnants may adhere inside the cylinder, a material having a good step coverage property such as a photoresist is first filled into the cylinder and is then polished or etch-backed until the capacitor oxide layer 34 is exposed. Thereafter, an ashing process is performed to remove the photoresist remaining inside the cylinder.

The conductive layer for forming the lower electrodes 35 is made of a metal selected from a group consisting of impurity like P or As doped polysilicon, TiN, TaN, W, WN, WSi, Ru, $RuO_2$, Ir, $IrO_2$ and Pt. In this first preferred embodiment, it is assumed that the lower electrodes 35 are made of polysilicon.

Next, a pre-cleaning process for removing a native oxide layer formed on the lower electrodes 35 and terminating hydrogens is performed. At this time, the pre-cleaning process uses a hydrofluoric acid (HF) mixed solution, obtained by diluting HF with water in a ratio of approximately 1 part of HF to approximately 10 parts to approximately 100 parts of water, or by diluting HF with ammonium fluoride ($NH_4F$) in a ratio of approximately 1 part of HF to approximately 5 parts to approximately 500 parts of $NH_4F$ along with use of deionized (DI) water mixture.

Before and/or after the pre-cleaning process, it is possible to clean the lower electrodes 35 by using one of an ammonium hydroxide ($NH_4OH$) mixture, obtained by mixing $NH_4OH$, hydrogen peroxide ($H_2O_2$) and water ($H_2O$), and a sulfuric acid mixture, obtained by mixing $H_2SO_4$ and $H_2O_2$, or $H_2SO_4$ and $H_2O$, in order to remove organic or inorganic residues on the lower electrodes 35.

Figure 5B:
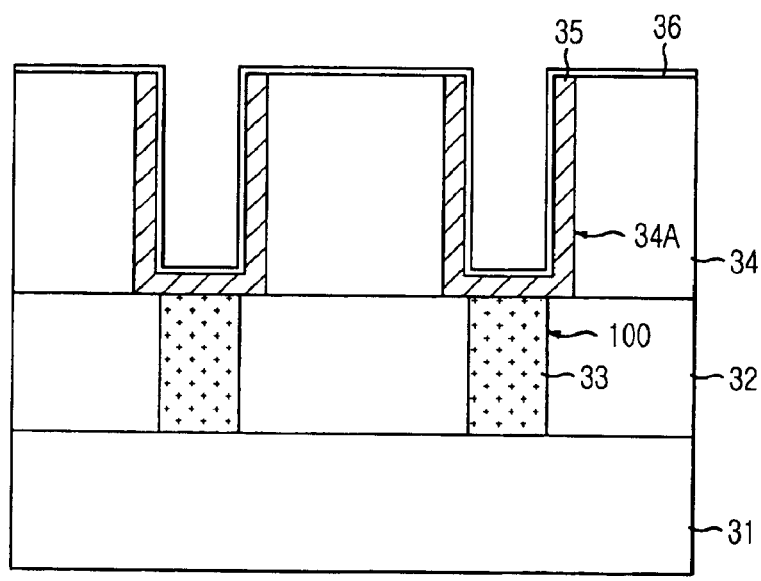

Referring to FIG. 5B, a nitride layer 36 is formed on the lower electrodes 35. At this time, the nitride layer 36 serves as a diffusion barrier layer for preventing silicon or doped impurities of the lower electrodes 35 from diffusing into an $Al_2O_3$ layer contacting the lower electrodes 35 made of impurity doped polysilicon.

The nitride layer 35 serving as the diffusion barrier layer is obtained by nitriding surfaces of the lower electrodes 35. For instance, a plasma thermal process can be employed for approximately 1 minute to approximately 5 minutes to nitride the lower electrodes 35. Particularly, the plasma thermal process proceeds at a temperature ranging from approximately 200° C. to approximately 500° C. and a pressure ranging from approximately 0.1 torr to approximately 10 torr in an atmosphere of ammonia ($NH_3$) provided with a flow quantity ranging from approximately 25 sccm to approximately 250 sccm under a radio frequency power supplied in a range from approximately 100 W to approximately 500 W.

Another method of nitriding the lower electrodes 35 is to perform a thermal process at a RTP chamber set in an ascending pressure ranging from approximately 750 torr to approximately 760 torr or in a descending pressure ranging from approximately 1 torr to approximately 100 torr along with a maintained temperature ranging from approximately 600° C. to approximately 800° C. At this time, the thermal process is carried out in an atmosphere of ammonia ($NH_3$) provided with a flow quantity ranging from approximately 25 sccm to approximately 250 sccm. Also, it is still possible to employ an annealing process at an electric furnace set in the same condition for the RTP chamber. These described methods also make a surface of the capacitor oxide layer 34 made of silicon oxide nitrided.

Figure 5C:
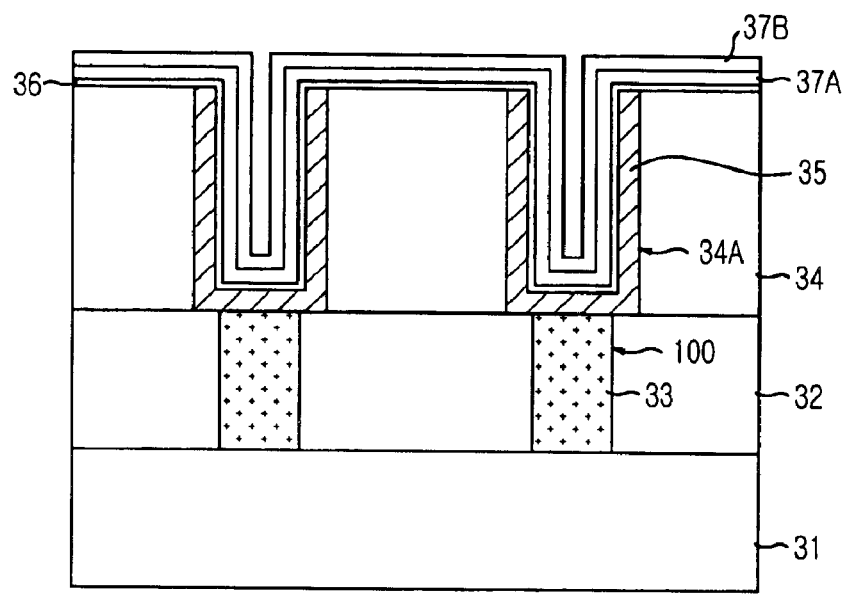

Referring to FIG. 5C, an $Al_2O_3$ layer 37A and a $La_2O_3$ layer 37B are sequentially formed on the nitride layer 36 by performing one of an ALD method, a pulsed CVD method and a LP-CVD method at a temperature ranging from approximately 200° C. to approximately 500° C.

Next, a thermal process for crystallizing the $Al_2O_3$ layer 37A and the $La_2O_3$ layer 37B and removing impurities is carried out at a temperature ranging from approximately 500° C. to approximately 900° C. in an atmosphere of $N_2$. At this time, the thermal process proceeds at an electric furnace or a RTP apparatus set in an ascending or descending pressure in an atmosphere of $N_2$.

Figure 5D:
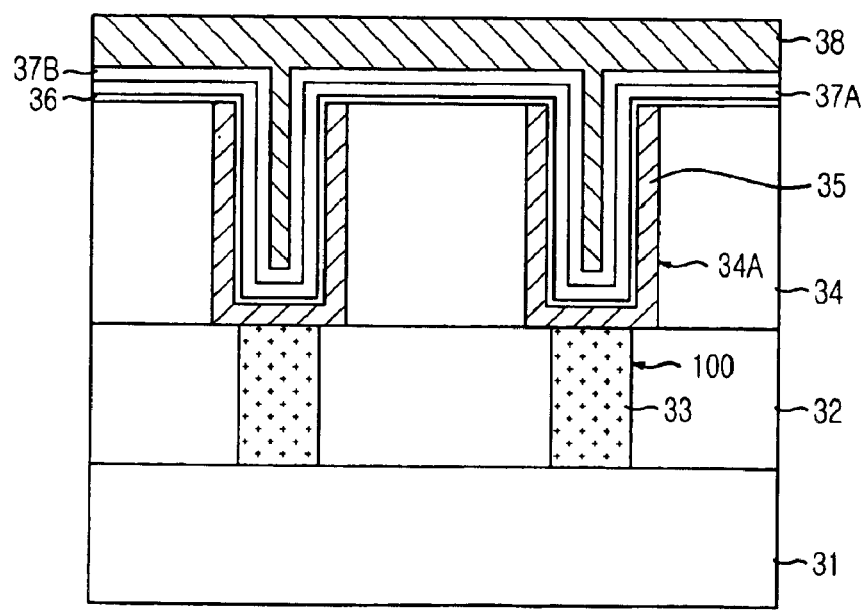

Referring to FIG. 5D, an upper electrode 38 is formed on the $La_2O_3$ layer 37B. Herein, the upper electrode 38 is made of a metal-based conductive material selected from a group consisting of impurity like As or P doped polysilicon, TiN, TaN, W, WN, WSi, Ru, $RuO_2$, Ir, $IrO_2$ and Pt. In case of forming the upper electrode 38 by using the metal-based conductive material, silicon nitride or doped polysilicon can be used as a passivation layer or a buffer layer to improve structural stability to humidity, temperature and electric shock. At this time, although not illustrated, the passivation layer or the buffer layer is formed on the upper electrode 38 with a thickness ranging from approximately 200 Å to approximately 1,000 Å.

If the upper electrode 38 is made of impurity doped polysilicon, it is necessary to form the diffusion barrier layer for preventing silicon or impurities existing inside the upper electrode 38 from diffusing into the dual dielectric structure. This diffusion barrier layer contains nitrogen as similar to the nitride layer 36 formed on the lower electrodes 35.

That is, the diffusion barrier layer is obtained by nitriding a surface of the $La_2O_3$ layer 37B through performing a plasma thermal process for approximately 1 minute to approximately 5 minutes. At this time, the plasma thermal process is carried out at a temperature ranging from approximately 200° C. to approximately 500° C. and a pressure ranging from approximately 0.1 torr to approximately 10 torr in an atmosphere of $NH_3$ provided with a flow quantity ranging from approximately 25 sccm to approximately 250 sccm under supplying a radio frequency power ranging from approximately 100 W to approximately 500 W.

Another method of nitriding the $La_2O_3$ layer 37B is to perform a thermal process at a RTP chamber maintained with, a temperature ranging from approximately 600° C. to approximately 800° C. in an atmosphere of $NH_3$ provided with a flow quantity ranging from approximately 25 sccm to approximately 250 sccm under an increasing pressure ranging from approximately 750 torr to approximately 760 torr, or under a decreasing pressure ranging from approximately 1 torr to approximately 100 torr. The $La_2O_3$ layer 37B can also be nitrided by performing a thermal process at an electric furnace under the same condition for the above described thermal process at the RTP chamber.

In accordance with the first preferred embodiment of the present invention, the $Al_2O_3$ layer having a capability of suppressing generation of leakage currents and the $La_2O_3$ layer having a high dielectric constant are used as the dual dielectric structure, thereby decreasing an equivalent oxide thickness to less than approximately 15 Å compared with a capacitor with a single dielectric layer. As a result, it is possible to secure a capacitance over approximately 30 fF per cell.

Also , the $Al_2O_3$ layer having a capability of suppressing generation of leakage currents and the $La_2O_3$ layer having a good heat-resistance are stacked to form the dual dielectric structure of a capacitor, thereby obtaining stability to heat during the application of a high thermal process. Thus, the thermal process performed after the formation of the dual dielectric structure can be carried out without limitation in temperature.

Furthermore, the $Al_2O_3$ and $La_2O_3$ stacked dielectric structure makes it possible to control the leakage current characteristic and the break down voltage characteristic to be less than approximately 0.5 fF per cell and greater than approximately 2.0 V at approximately 1 pA per cell, respectively. Thus, compared with the capacitor having a single oxide layer, the dual dielectric structure provides an effect of improving durability and electric function of the capacitor in a group of USLI products.

Although the first preferred embodiment of the present invention exemplifies the case of forming the dual dielectric structure by sequentially stacking the $Al_2O_3$ layer and the $La_2O_3$ layer. However, it is also possible to form a dielectric structure with inversely stacked oxide layers, i.e., the $La_2O_3$ and $Al_2O_3$ stacked dual dielectric structure. If the dielectric layer contacting the lower electrode is the $La_2O_3$ layer, there is a disadvantage that a leakage current characteristic of the $La_2O_3$ layer becomes deteriorated because the $La_2O_3$ layer has a lower energy band gap than the $Al_2O_3$ layer. Thus, it is preferable to form the dual dielectric structure obtained stacked in order of the $Al_2O_3$ layer and the $La_2O_3$ layer.

FIGS. 6A to 6D are cross-sectional views illustrating a method for fabricating a capacitor in accordance with a second preferred embodiment of the present invention.

Figure 6A:
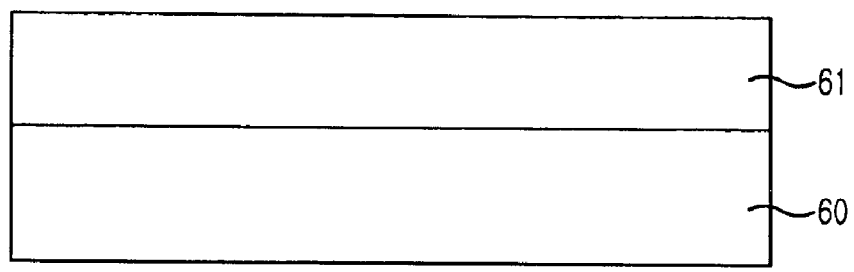
FIGS. 6A to 6D are cross-sectional views illustrating a method for fabricating a capacitor with an aluminum oxide and lanthanum oxide laminated dielectric structure in accordance with a second preferred embodiment of the present invention.

Referring to FIG. 6A, a lower electrode 61 made of polysilicon is formed on a substrate 60. Since the second preferred embodiment of the present invention can be applicable to a SIS capacitor, a metal insulator silicon (MIS) capacitor and a MIM capacitor, the lower electrode 61 can be also made of a material selected from a group consisting of Pt, Ru, Ir, $RuO_2$, $IrO_2$, TiN and WN.

Figure 6B:
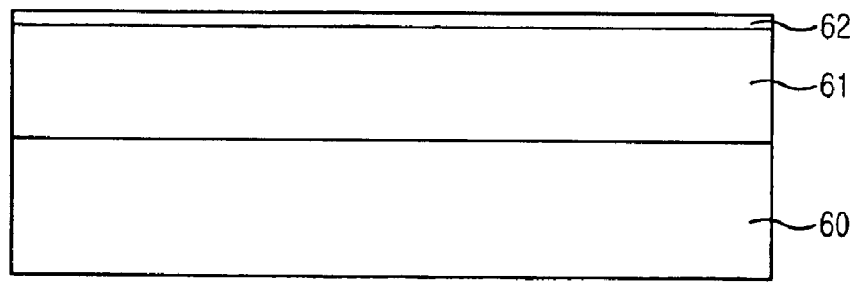

Referring to FIG. 6B, a surface of the lower electrode 61 is nitrided in order to prevent an interface of the lower electrode 61 from being oxidized during formation of a subsequent dielectric layer. Particularly, the lower electrode 61 becomes nitrided at a temperature ranging from approximately 800° C. to approximately 1,200° C. in an atmosphere of $NH_3$ for approximately 10 seconds to approximately 120 seconds, thereby obtaining a thin silicon nitride (SiN) layer 12.

Figure 6C:
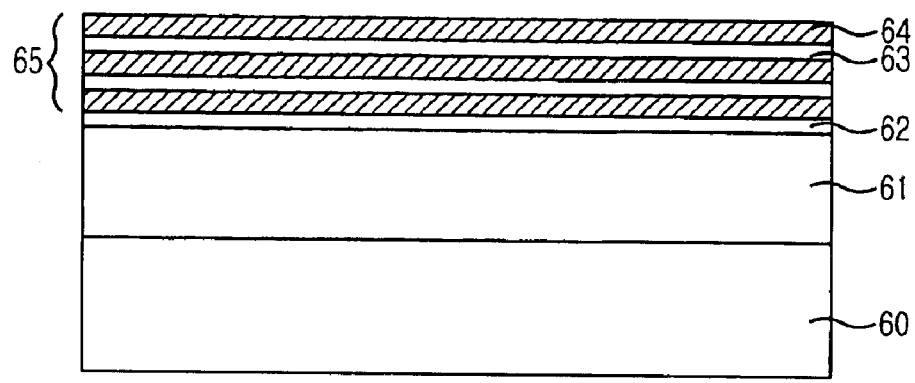

Referring to FIG. 6C, an aluminum oxide ($Al_2O_3$) layer 63, having a low dielectric constant but having a good leakage current characteristic, and a lanthanum oxide ($La_2O_3$) layer 64, having a high dielectric constant and a good leakage current characteristic compared with hafnium oxide ($HfO_2$), are formed alternately each with a predetermined thickness by employing an ALD method. After the ALD method, the $Al_2O_3$ layer 63 and the $La_2O_3$ layer 64 are formed in a laminated type, thereby providing a dielectric layer 65.

At this time, the order of depositing the $Al_2O_3$ layer 63 and the $La_2O_3$ layer 64 can be switched, and each of the $Al_2O_3$ layer 63 and the $La_2O_3$ layer 64 has the predetermined thickness ranging from approximately 5 Å to approximately 20 Å.

In case of forming the $Al_2O_3$ layer 63 with the above mentioned predetermined thickness by performing the ALD method, a source gas of aluminum is trimethylaluminum (TMA), and a reaction gas is one of $O_3$ and $H_2O$ vapor. Also, the substrate 60 is maintained with a temperature ranging from approximately 250° C. to approximately 450° C.

In case of forming the $La_2O_3$ layer 64 with the above mentioned predetermined thickness by performing the ALD method, examples of a lanthanum source gas are $La(iPrAMD)_3$ and $La(THD)_3$, and a reaction gas is one of $O_3$ and $H_2O$ vapor. Also, the substrate 60 is maintained with a temperature ranging from approximately 250° C. to approximately 450° C.

In addition, a total thickness of the dielectric layer formed in a laminated type by alternately forming the $Al_2O_3$ layer 63 and the $La_2O_3$ layer 64 each with the predetermined process is controlled to be in a range from approximately 25 Å to approximately 200 Å. Hereinafter, the above type of dielectric layer 65 is referred as an $Al_2O_3$ and $La_2O_3$ laminated dielectric layer.

Next, an annealing process for densifying the $Al_2O_3$ and $La_2O_3$ laminated dielectric layer is performed. Particularly, a rapid thermal process is employed as the annealing process and is performed at a temperature ranging from approximately 500° C. to approximately 800° C. in an atmosphere of $N_2$ for approximately 30 seconds to approximately 120 seconds.

Figure 6D:
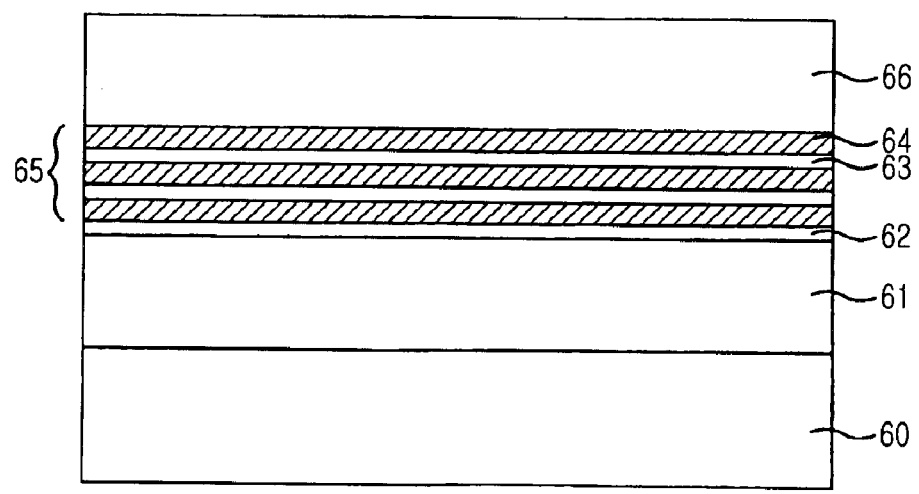

Referring to FIG. 6D, an upper electrode 66 is formed on the above resulting structure. The upper electrode 66 is made of a material selected from a group consisting of N-type impurity doped polysilicon, Pt, Ru, Ir, $RuO_2$, $IrO_2$, TiN and WN.

The above described second preferred embodiment of the present invention can be applied to a three dimensional capacitor having a cylinder structure or a concave structure in devices having a linewidth less than approximately 0.1 μm. As explained above, the second preferred embodiment of the present invention can be applicable to a capacitor formed in a SIS type, a MIS type or a MIM type. Additionally, since the above described dielectric layer having a relatively thin thickness makes it possible to secure a good leakage current characteristic, the dielectric layer can be applied to a device with a linewidth less than approximately 100 nm.

On the basis of the first and the second preferred embodiments of the present invention, the dielectric structure is formed by employing the $Al_2O_3$ layer having an excellent leakage current characteristic and the $La_2O_3$ layer having a high dielectric constant. Particularly, thicknesses of the $Al_2O_3$ layer and the $La_2O_3$ layer are controlled to be in a predetermined range, so that an intended high capacitance can be secured.

Compared with the single dielectric layer, the dielectric structure formed by employing the $Al_2O_3$ layer having a capability of suppressing generation of leakage currents and the $La_2O_3$ layer having a good heat-resistance has stability to heat during the application of a high thermal process. As a result, the thermal process subsequently performed after the formation of the dual dielectric structure can be carried out without limiting an applicable temperature range.

Furthermore, since the $Al_2O_3$ and $La_2O_3$ stacked dielectric structure is capable of controlling the leakage current characteristic, durability and electric function of the capacitor can also be improved.

The present application contains subject matter related to the Korean patent application Nos. KR 2003-98521 and KR 2003-98558, filed in the Korean Patent Office on Dec. 29, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A capacitor, comprising:
   a lower electrode;
   a first dielectric layer with a high energy band gap formed on the lower electrode;
   a second dielectric layer formed on the first dielectric layer, the second dielectric layer with a high dielectric constant, wherein an energy band gap of the second dielectric layer is lower than the energy band gap of the first dielectric layer and wherein the first dielectric layer is a lanthanum oxide layer and the second oxide layer is an aluminum oxide layer; and
   an upper electrode formed on the second dielectric layer.

2. A method for fabricating a capacitor, comprising the steps of:
   (a) forming a lower electrode;
   (b) forming a first dielectric layer having a high energy band gap on the lower electrode, wherein at the step (b), an aluminum (Al) source is selected among precursors based on aluminum containing metal organic compounds and an oxidizing agent is selected from a group consisting of ozone ($O_3$) having a concentration of approximately 200±20 $g/m^3$, oxygen ($O_2$) and water ($H_2O$) vapor;
   (c) forming a second dielectric layer on the first dielectric layer, the second dielectric layer having a high dielectric constant, wherein an energy band gap of the second dielectric layer is lower than the energy band gap of the first dielectric layer; and
   (d) forming an upper electrode on the second dielectric layer,
   wherein the first dielectric layer is an aluminum oxide layer and the second dielectric layer is a lanthanum oxide layer; and
   wherein the aluminum oxide layer and the lanthanum oxide layer are formed by employing one of an atomic layer deposition method, a pulsed chemical vapor deposition method and a low pressure chemical vapor deposition method.

3. The method of claim 2, wherein at the step (c), a lanthanum source is selected among precursors based on lanthanum containing metal organic compounds and an oxidizing agent is selected from a group consisting Of $O_3$ having a concentration of approximately $200\pm20$ g/m$^3$, $O_2$ and $H_2O$ vapor.

4. The method of claim 3, wherein the precursors based on lanthanum containing metal organic compounds are $La(CH_3)_3$ and $La(C_2H_5)_3$.

5. The method of claim 2, wherein the precursors based on aluminum containing metal organic compounds are $Al(CH_3)_3$ and $Al(C_2H_5)_3$.

6. The method of claim 2, wherein the first dielectric layer is a lanthanum oxide layer and the second dielectric layer is an aluminum oxide layer.

7. A method for fabricating a capacitor, comprising the steps of:
   (a) forming a lower electrode by using impurity doped polysilicon;
   (b) nitriding the lower electrode;
   (c) forming a dual dielectric structure by sequentially stacking an aluminum oxide layer and a lanthanum oxide layer on the nitrided lower electrode;
   (d) performing a thermal process for crystallizing the dual dielectric structure and removing impurities;
   (e) nitriding the crystallized dual dielectric structure; and
   (f) forming an upper electrode on the nitrided dual dielectric structure, the upper electrode made of impurity doped polysilicon.

8. The method of claim 7, wherein the aluminum oxide layer and the lanthanum oxide layer are formed by employing one of an atomic layer deposition method, a pulsed chemical vapor deposition method and a low pressure chemical vapor deposition method.

9. The method of claim 7, wherein the aluminum oxide layer has a thickness ranging from approximately 5 Å to approximately 30 Å and the lanthanum oxide layer has a thickness ranging from approximately 10 Å to approximately 50 Å.

10. The method of claim 7, wherein the step (d) proceeds at a chamber maintained with a temperature ranging from approximately 500° C. to approximately 900° C. in an atmosphere of nitrogen under one of an ascending pressure and a descending pressure.

11. The method of claim 7, wherein the steps (b) and (e) proceed by performing a plasma thermal process at a temperature ranging from approximately 200° C. to approximately 500° C., a pressure ranging from approximately 0.1 torr to approximately 10 torr and a radio frequency power ranging from approximately 100 W to approximately 500 W in an atmosphere of ammonia ($NH_3$) provided with a flow quantity ranging from approximately 25 sccm to approximately 250 sccm for approximately 1 minute to approximately 5 minutes.

12. The method of claim 7, wherein the steps (b) and (e) proceed by performing a rapid thermal process at a temperature ranging from approximately 600° C. to approximately 800° C. in an atmosphere of $NH_3$ provided with a flow quantity ranging from approximately 25 sccm to approximately 250 sccm under one of an ascending pressure ranging from approximately 750 torr to approximately 760 torr and a descending pressure ranging from approximately 1 torr to approximately 100 torr.

13. The method of claim 7, wherein the steps (b) and (e) proceed at an electric furnace maintained with a temperature ranging from approximately 600° C. to approximately 800° C. in an atmosphere of $NH_3$ provided with a flow quantity ranging from approximately 25 sccm to approximately 250 sccm under one of an ascending pressure ranging from approximately 750 torr to approximately 760 torr and a descending pressure ranging from approximately 1 torr to approximately 100 torr.

14. The method of claim 7, wherein after the step (a), further including the steps of:
   (a1) performing a first cleaning process for removing a native oxide layer formed on the lower electrode; and
   (b1) per forming a second cleaning process for removing impurities on the lower electrode before and after the step (a1).

15. The method of claim 14, wherein the first cleaning process uses a hydrofluoric acid (HF) mixed solution and the second cleaning process uses an ammonium hydroxide ($NH_4OH$) mixed solution and sulfuric acid ($H_2SO_4$) mixed solution.

16. A method for fabricating a capacitor, comprising the steps of:
   (a) forming a lower electrode;
   (b) alternately stacking a laminated aluminum oxide layer and a laminated lanthanum oxide layer each having a predetermined thickness on the lower electrode by employing an atomic layer deposition method to thereby obtain an alternately stacked dielectric layer, wherein at the step (b), the laminated aluminum oxide layer is formed by using trimethylaluminum as a source gas of aluminum and at a temperature ranging from approximately 250° C. to approximately 450° C;
   (c) performing a thermal process to the alternately stacked dielectric layer; and
   (d) forming an upper electrode on the alternately stacked dielectric layer.

17. The method of claim 16, wherein at the step (b), the laminated lanthanum oxide layer is formed by using one of La(iPrAMD) and La(THD)TMA as a source gas of lanthanum and at a temperature ranging from approximately 250° C. to approximately 450° C.

18. The method of claim 16, wherein the step (b), the alternately stacked dielectric layer has a thickness ranging from approximately 25 Å to approximately 200 Å.

19. The method of claim 16, wherein at the step (a), the lower electrode is made of a material selected from a group consisting of doped polysilicon, platinum (Pt), ruthenium (Ru), iridium (Ir), ruthenium oxide ($RuO_2$), iridium oxide ($IrO_2$), titanium nitride (TiN), and tungsten nitride (WN).

20. The method of claim 19, wherein the step (a) of forming the lower electrode which is made of doped polysilicon further includes the step of nitriding a sur face of the lower electrode.

21. The method of claim 16, wherein the step (C) proceeds by employing a rapid thermal process at a temperature ranging from approximately 500° C. to approximately 800° C. in an atmosphere of nitrogen ($N_2$) for approximately 30 seconds to approximately 120 seconds.

* * * * *